(12) United States Patent
Hogaboam et al.

(10) Patent No.: US 11,374,594 B2
(45) Date of Patent: Jun. 28, 2022

(54) APPARATUS AND METHOD INCLUDING NEURAL NETWORK LEARNING TO DETECT AND CORRECT QUANTUM ERRORS

(71) Applicant: Intel Corporation, Santa Clara, CA (US)

(72) Inventors: Justin Hogaboam, Aloha, OR (US); Narayan Srinivasa, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 905 days.

(21) Appl. No.: 15/972,114

(22) Filed: May 5, 2018

(65) Prior Publication Data

US 2019/0044542 A1  Feb. 7, 2019

(51) Int. Cl.
*H03M 13/15* (2006.01)
*G06N 3/08* (2006.01)
*H03M 13/00* (2006.01)
*G06N 10/00* (2022.01)
*G06N 3/063* (2006.01)
*G06N 3/04* (2006.01)
*H03M 13/05* (2006.01)

(52) U.S. Cl.
CPC ........ *H03M 13/1575* (2013.01); *G06N 3/049* (2013.01); *G06N 3/0635* (2013.01); *G06N 3/088* (2013.01); *G06N 10/00* (2019.01); *H03M 13/611* (2013.01); *H03M 13/05* (2013.01)

(58) Field of Classification Search
CPC ...... G06N 3/088; G06N 3/049; G06N 3/0635; G06N 10/00; G06N 13/611; G06N 13/05; H03M 13/611; H03M 13/1575
See application file for complete search history.

(56) References Cited

U.S. PATENT DOCUMENTS

| | | | | |
|---|---|---|---|---|
| 5,166,938 A | * | 11/1992 | Chung | H03M 13/00 714/759 |
| 5,768,297 A | * | 6/1998 | Shor | B82Y 10/00 714/763 |
| 8,510,618 B1 | * | 8/2013 | Pesetski | B82Y 10/00 714/746 |

(Continued)

OTHER PUBLICATIONS

G. J. Milburn, M. Sarovar and C. Ahn, "Quantum control and quantum error correction," 2004 5th Asian Control Conference (IEEE Cat. No.04EX904), 2004.*

(Continued)

*Primary Examiner* — Steve N Nguyen
(74) *Attorney, Agent, or Firm* — Nicholson De Vos Webster & Elliott LLP

(57) ABSTRACT

Apparatus and method for neural network learning to detect and correct quantum errors. For example, one embodiment of an apparatus comprises. For example, one embodiment of an apparatus comprises: a quantum processor comprising one or more data quantum bits (qbits) and one or more ancilla qbits; an error decoder to decode a state of at least one of the ancilla qbits to generate an error syndrome related to one or more qbit errors; a neural network to evaluate the error syndrome and to either identify a known corrective response for correcting the error or to perform unsupervised learning to identify a corrective response to the error syndrome.

20 Claims, 15 Drawing Sheets

(56) References Cited

U.S. PATENT DOCUMENTS

| | | | | |
|---|---|---|---|---|
| 9,748,976 | B2* | 8/2017 | Naaman | H03M 13/1575 |
| 10,248,491 | B1* | 4/2019 | Zeng | G06N 10/00 |
| 10,374,612 | B1* | 8/2019 | Sinclair | H03K 19/195 |
| 2008/0185576 | A1* | 8/2008 | Hollenberg | G06N 10/00 |
| | | | | 257/14 |
| 2014/0365843 | A1* | 12/2014 | Ashikhmin | H03M 13/1148 |
| | | | | 714/758 |
| 2016/0125311 | A1* | 5/2016 | Fuechsle | G06N 20/00 |
| | | | | 257/31 |
| 2016/0247062 | A1* | 8/2016 | Amir | G06N 3/049 |
| 2017/0118079 | A1* | 4/2017 | Baughman | H04L 67/18 |
| 2019/0266512 | A1* | 8/2019 | Shen | H04B 10/70 |

OTHER PUBLICATIONS

A. S. Hadi, "Linear block code decoder using neural network," 2008 IEEE International Joint Conference on Neural Networks (IEEE World Congress on Computational Intelligence), Hong Kong, China, 2008.*

D. Kumar, A. Agrawal and G. S. Phartiyal, "Non iterative LDPC decoding by syndrome generation using Artificial Neural Network," 2015 National Conference on Recent Advances in Electronics & Computer Engineering (RAECE), 2015.*

M. Tanaka, K. Takeya, M. Kanaya and Y. Chigusa, "Associative digital neural network based on code and graph theories," IEEE International Symposium on Circuits and Systems,, 1989, pp. 2193-2196 vol. 3, doi: 10.1109/ISCAS.1989.*

Torlai, Giacomo et al. "A Neural Decoder for Topological Codes". Oct. 17, 2016.*

Kelly et al., "Scalable in-situ qubit calibration during repetitive error detection", Physical Review A, vol. 94, No. 3, arXiv:1603.03082v1, Mar. 9, 2016, 8 pages.

Mavadia et al., "Prediction and real-time compensation of qubit decoherence via machine learning", Nature Communications, vol. 8, No. 14106, Jan. 2017, pp. 1-6.

Torlai et al., "A Neural Decoder for Topological Codes", Physical Review Letters, vol. 119, No. 3, arXiv:1610.04238v1, Oct. 13, 2016, pp. 1-6.

Varsamopoulos et al., "Decoding Small Surface Codes with Feedforward Neural Networks", Quantum Science and Technology, vol. 3, No. 1, arXiv:1705.00857v1, May 2, 2017, pp. 1-13.

* cited by examiner

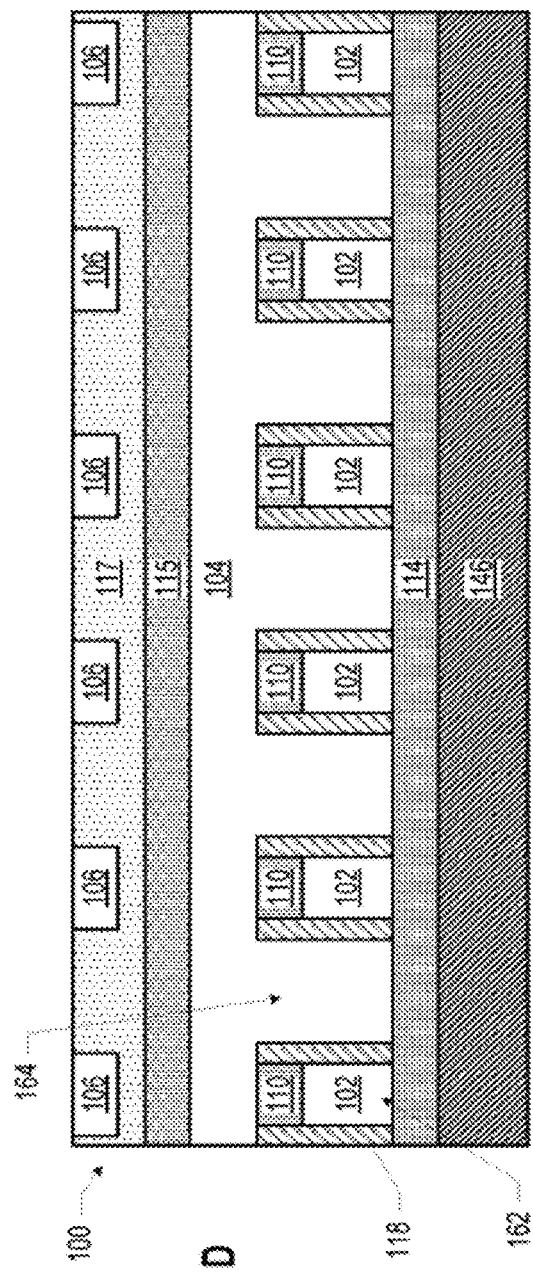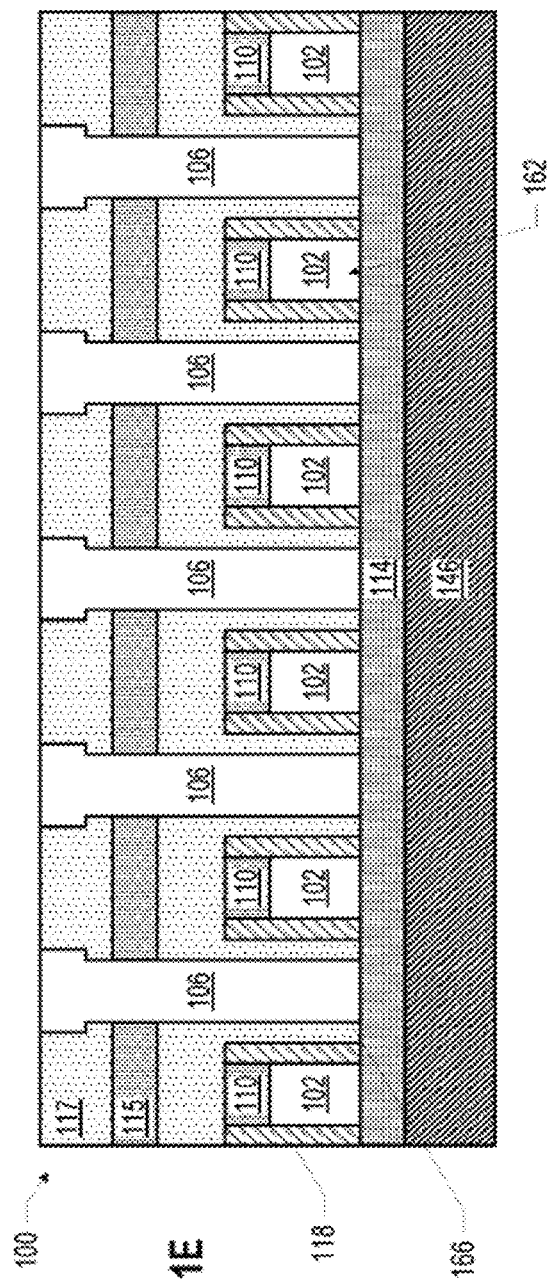

APPARATUS AND METHOD INCLUDING NEURAL NETWORK LEARNING TO DETECT AND CORRECT QUANTUM ERRORS

BACKGROUND

Field of the Invention

The embodiments of the invention relate generally to the field of quantum computing. More particularly, these embodiments relate to an apparatus and method including neural network learning to detect and correct quantum errors.

Description of the Related Art

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

A better understanding of the present invention can be obtained from the following detailed description in conjunction with the following drawings, in which:

FIGS. 1A-1F illustrate various views of an example quantum dot device, in accordance with one embodiment;

DETAILED DESCRIPTION

Figure 1A:
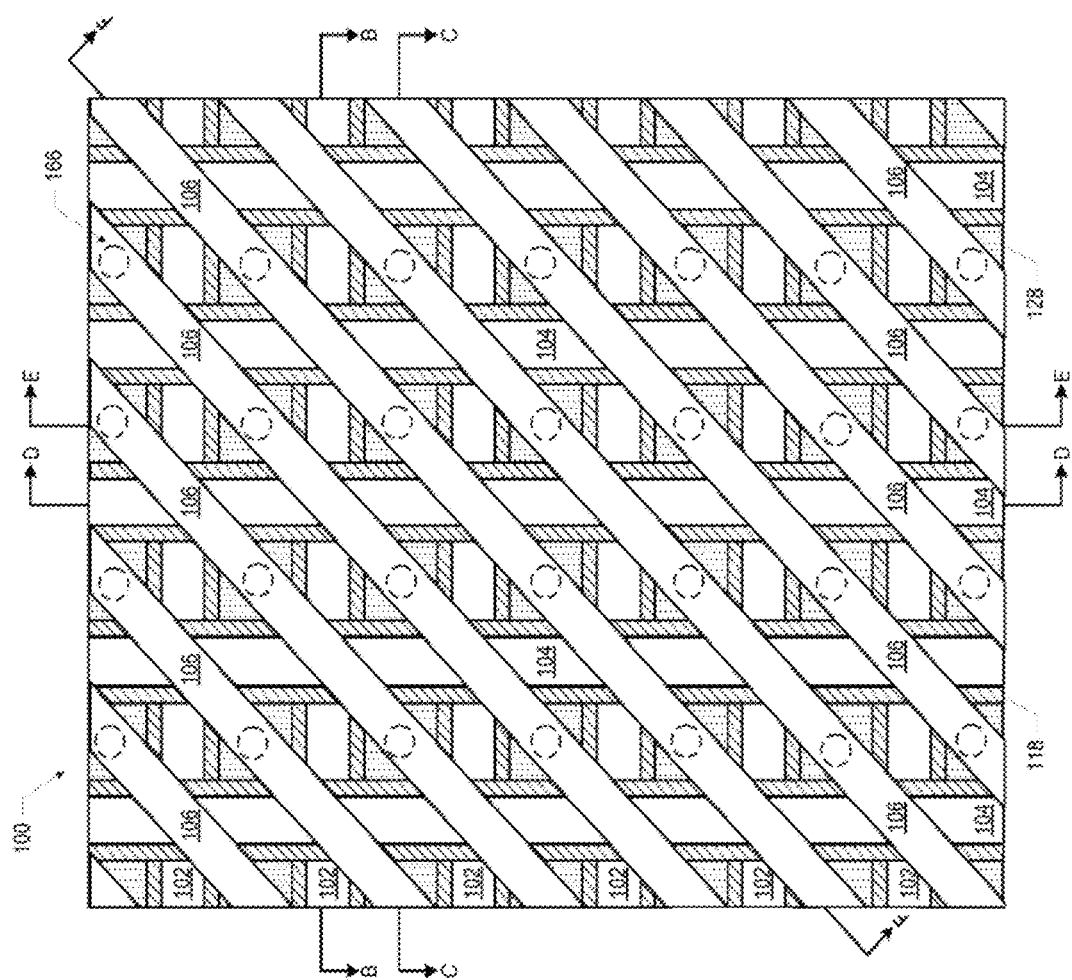

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

Introduction

A quantum computer uses quantum-mechanical phenomena such as superposition and entanglement to perform computations. In contrast to digital computers which store data in one of two definite states (0 or 1), quantum computation uses quantum bits (qbits), which can be in superpositions of states. Qbits may be implemented using physically distinguishable quantum states of elementary particles such as electrons and photons. For example, the polarization of a photon may be used where the two states are vertical polarization and horizontal polarization. Similarly, the spin of an electron may have distinguishable states such as "up spin" and "down spin."

Qbit states are typically represented by the bracket notations $|0\rangle$ and $|1\rangle$. In a traditional computer system, a bit is exclusively in one state or the other, i.e., a '0' or a '1.' However, qbits in quantum mechanical systems can be in a superposition of both states at the same time, a trait that is unique and fundamental to quantum computing.

Quantum computing systems execute algorithms containing quantum logic operations performed on qubits. The sequence of operations is statically compiled into a schedule and the qubits are addressed using an indexing scheme. This algorithm is then executed a sufficiently large number of times until the confidence interval of the computed answer is above a threshold (e.g., ~95+%). Hitting the threshold means that the desired algorithmic result has been reached.

Qbits have been implemented using a variety of different technologies which are capable of manipulating and reading quantum states. These include, but are not limited to quantum dot devices (spin based and spatial based), trapped-ion devices, superconducting quantum computers, optical lattices, nuclear magnetic resonance computers, solid-state NMR Kane quantum devices, electrons-on-helium quantum computers, cavity quantum electrodynamics (CQED) devices, molecular magnet computers, and fullerene-based ESR quantum computers, to name a few. Thus, while a quantum dot device is described below in relation to certain embodiments of the invention, the underlying principles of the invention may be employed in combination with any type of quantum computer including, but not limited to, those listed above. The particular physical implementation used for qbits is orthogonal to the embodiments of the invention described herein.

Quantum Dot Devices

Quantum dots are small semiconductor particles, typically a few nanometers in size. Because of this small size, quantum dots operate according to the rules of quantum mechanics, having optical and electronic properties which differ from macroscopic entities. Quantum dots are sometimes referred to as "artificial atoms" to connote the fact that a quantum dot is a single object with discrete, bound electronic states, as is the case with atoms or molecules.

Figure 1B:
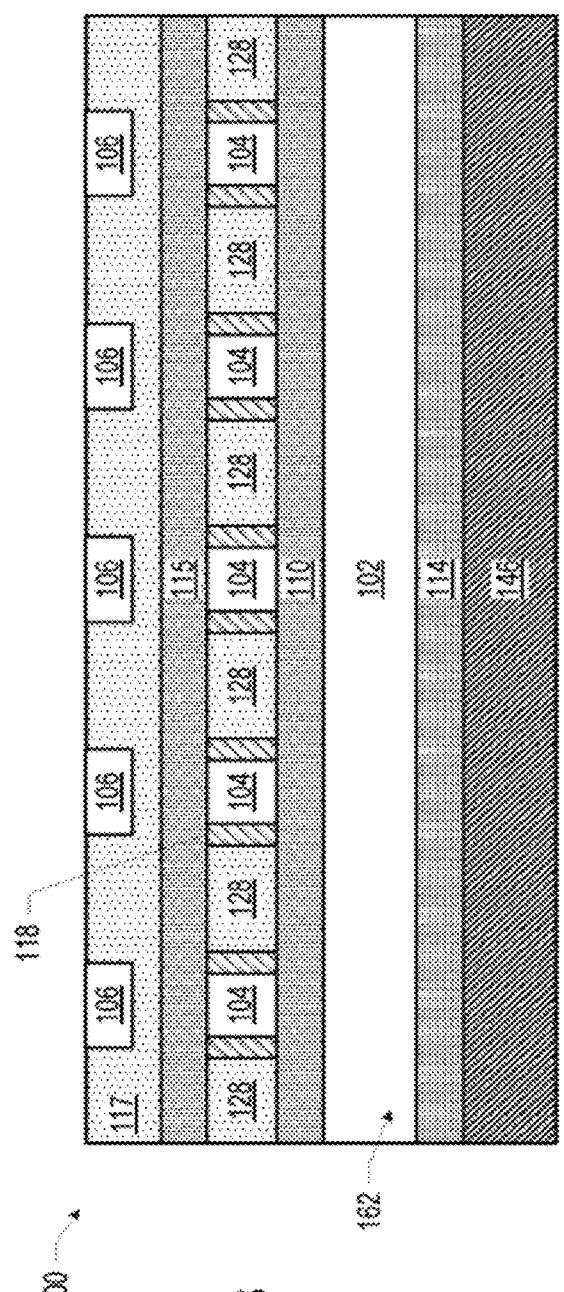
Figure 1C:
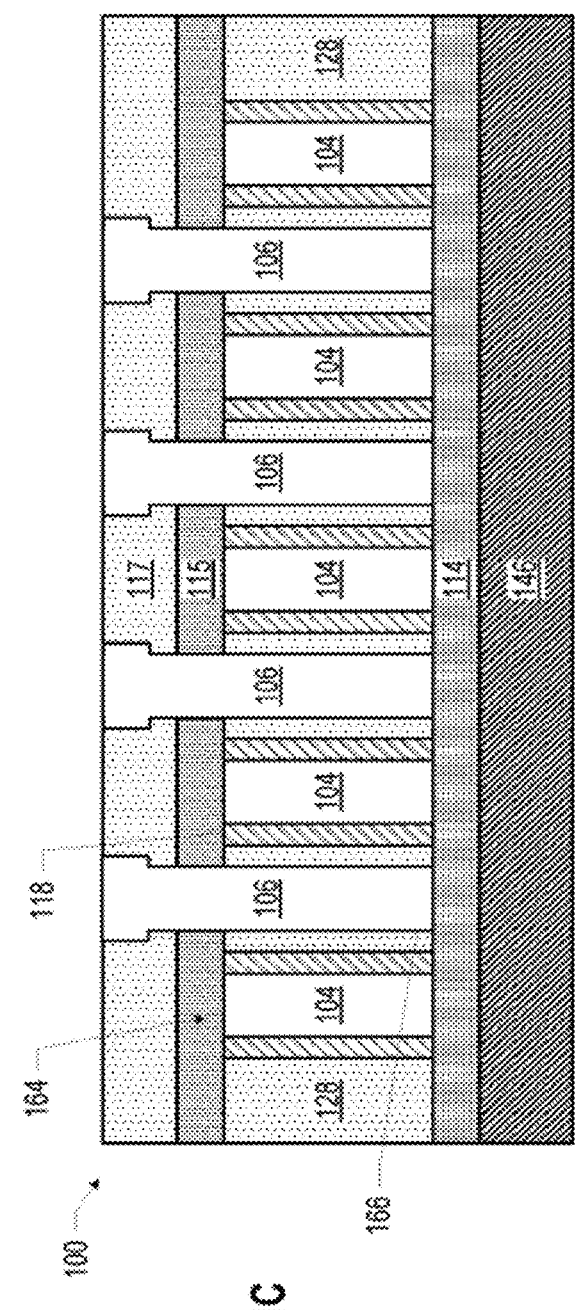
Figure 1F:
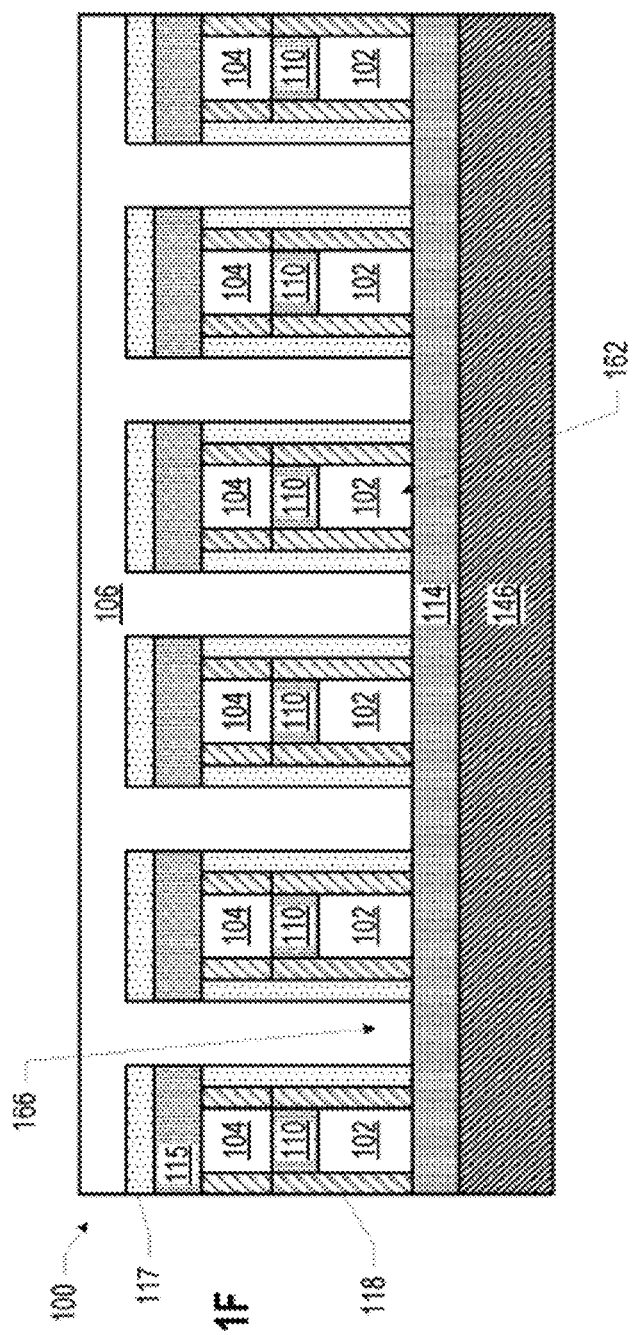

FIGS. 1A-1F are various views of a quantum dot device 100, which may be used with embodiments of the invention described below. FIG. 1A is a top view of a portion of the quantum dot device 100 with some of the materials removed so that the first gate lines 102, the second gate lines 104, and the third gate lines 106 are visible. Although many of the drawings and description herein may refer to a particular set of lines or gates as "barrier" or "quantum dot" lines or gates, respectively, this is simply for ease of discussion, and in other embodiments, the role of "barrier" and "quantum dot" lines and gates may be switched (e.g., barrier gates may instead act as quantum dot gates, and vice versa). FIGS. 1B-1F are side cross-sectional views of the quantum dot device 100 of FIG. 1A; in particular, FIG. 1B is a view through the section B-B of FIG. 1A, FIG. 1C is a view through the section C-C of FIG. 1A, FIG. 1D is a view through the section D-D of FIG. 1A, FIG. 1E is a view through the section E-E of FIG. 1A, and FIG. 1F is a view through the section F-F of FIG. 1A.

The quantum dot device 100 of FIG. 1 may be operated in any of a number of ways. For example, in some embodiments, electrical signals such as voltages, currents, radio frequency (RF), and/or microwave signals, may be provided to one or more first gate line 102, second gate line 104, and/or third gate line 106 to cause a quantum dot (e.g., an electron spin-based quantum dot or a hole spin-based quantum dot) to form in a quantum well stack 146 under a third gate 166 of a third gate line 106. Electrical signals provided to a third gate line 106 may control the electrical potential of a quantum well under the third gates 166 of that third gate line 106, while electrical signals provided to a first gate line 102 (and/or a second gate line 104) may control the potential energy barrier under the first gates 162 of that first gate line 102 (and/or the second gates 164 of that second gate line 104) between adjacent quantum wells. Quantum interactions between quantum dots in different quantum wells in the quantum well stack 146 (e.g., under different quantum dot gates) may be controlled in part by the potential energy barrier provided by the barrier potentials imposed between them (e.g., by intervening barrier gates).

Generally, the quantum dot devices 100 disclosed herein may further include a source of magnetic fields (not shown) that may be used to create an energy difference in the states of a quantum dot (e.g., the spin states of an electron spin-based quantum dot) that are normally degenerate, and the states of the quantum dots (e.g., the spin states) may be manipulated by applying electromagnetic energy to the gates lines to create quantum bits capable of computation. The source of magnetic fields may be one or more magnet lines, as discussed below. Thus, the quantum dot devices 100 disclosed herein may, through controlled application of electromagnetic energy, be able to manipulate the position, number, and quantum state (e.g., spin) of quantum dots in the quantum well stack 146.

In the quantum dot device 100 of FIG. 1, a gate dielectric 114 may be disposed on a quantum well stack 146. A quantum well stack 146 may include at least one quantum well layer 152 (not shown in FIG. 1) in which quantum dots may be localized during operation of the quantum dot device 100. The gate dielectric 114 may be any suitable material, such as a high-k material. Multiple parallel first gate lines 102 may be disposed on the gate dielectric 114, and spacer material 118 may be disposed on side faces of the first gate lines 102. In some embodiments, a patterned hardmask 110 may be disposed on the first gate lines 102 (with the pattern corresponding to the pattern of the first gate lines 102), and the spacer material 118 may extend up the sides of the hardmask 110, as shown. The first gate lines 102 may each be a first gate 162. Different ones of the first gate lines 102 may be electrically controlled in any desired combination (e.g., each first gate line 102 may be separately electrically controlled, or some or all the first gate lines 102 may be shorted together in one or more groups, as desired).

Multiple parallel second gate lines 104 may be disposed over and between the first gate lines 102. As illustrated in FIG. 1, the second gate lines 104 may be arranged perpendicular to the first gate lines 102. The second gate lines 104 may extend over the hardmask 110, and may include second gates 164 that extend down toward the quantum well stack 146 and contact the gate dielectric 114 between adjacent ones of the first gate lines 102, as illustrated in FIG. 1D. In some embodiments, the second gates 164 may fill the area between adjacent ones of the first gate lines 102/spacer material 118 structures; in other embodiments, an insulating material (not shown) may be present between the first gate lines 102/spacer material 118 structures and the proximate second gates 164. In some embodiments, spacer material 118 may be disposed on side faces of the second gate lines 104; in other embodiments, no spacer material 118 may be disposed on side faces of the second gate lines 104. In some embodiments, a hardmask 115 may be disposed above the second gate lines 104. Multiple ones of the second gates 164 of a second gate line 104 are electrically continuous (due to the shared conductive material of the second gate line 104 over the hardmask 110). Different ones of the second gate lines 104 may be electrically controlled in any desired combination (e.g., each second gate line 104 may be separately electrically controlled, or some or all the second gate lines 104 may be shorted together in one or more groups, as desired). Together, the first gate lines 102 and the second gate lines 104 may form a grid, as depicted in FIG. 1.

Multiple parallel third gate lines 106 may be disposed over and between the first gate lines 102 and the second gate lines 104. As illustrated in FIG. 1, the third gate lines 106 may be arranged diagonal to the first gate lines 102, and diagonal to the second gate lines 104. In particular, the third gate lines 106 may be arranged diagonally over the openings in the grid formed by the first gate lines 102 and the second gate lines 104. The third gate lines 106 may include third gates 166 that extend down to the gate dielectric 114 in the openings in the grid formed by the first gate lines 102 and the second gate lines 104; thus, each third gate 166 may be bordered by two different first gate lines 102 and two different second gate lines 104. In some embodiments, the third gates 166 may be bordered by insulating material 128; in other embodiments, the third gates 166 may fill the openings in the grid (e.g., contacting the spacer material 118 disposed on side faces of the adjacent first gate lines 102 and the second gate lines 104, not shown). Additional insulating material 117 may be disposed on and/or around the third gate lines 106. Multiple ones of the third gates 166 of a third gate line 106 are electrically continuous (due to the shared conductive material of the third gate line 106 over the first gate lines 102 and the second gate lines 104). Different ones of the third gate lines 106 may be electrically controlled in any desired combination (e.g., each third gate line 106 may be separately electrically controlled, or some or all the third gate lines 106 may be shorted together in one or more groups, as desired).

Although FIGS. 1A-F illustrate a particular number of first gate lines 102, second gate lines 104, and third gate lines 106, this is simply for illustrative purposes, and any number of first gate lines 102, second gate lines 104, and third gate lines 106 may be included in a quantum dot device 100. Other examples of arrangements of first gate lines 102, second gate lines 104, and third gate lines 106 are possible. Electrical interconnects (e.g., vias and conductive lines) may contact the first gate lines 102, second gate lines 104, and third gate lines 106 in any desired manner.

Not illustrated in FIG. 1 are accumulation regions that may be electrically coupled to the quantum well layer of the quantum well stack 146 (e.g., laterally proximate to the quantum well layer). The accumulation regions may be spaced apart from the gate lines by a thin layer of an intervening dielectric material. The accumulation regions may be regions in which carriers accumulate (e.g., due to doping, or due to the presence of large electrodes that pull carriers into the quantum well layer), and may serve as reservoirs of carriers that can be selectively drawn into the areas of the quantum well layer under the third gates 166 (e.g., by controlling the voltages on the quantum dot gates, the first gates 162, and the second gates 164) to form carrier-based quantum dots (e.g., electron or hole quantum dots, including a single charge carrier, multiple charge carriers, or no charge carriers). In other embodiments, a quantum dot device 100 may not include lateral accumulation regions, but may instead include doped layers within the quantum well stack 146. These doped layers may provide the carriers to the quantum well layer. Any combination of accumulation regions (e.g., doped or non-doped) or doped layers in a quantum well stack 146 may be used in any of the embodiments of the quantum dot devices 100 disclosed herein.

Apparatus and Method Including a Thermal Noise Adaptive Scheduler for Controlling a Quantum Computer Regardless of the manner in which qbits are implemented, continuous operation of a quantum computer requires maintenance of the quantum information contained in the qubits over long sequences of gate operations. For example, when quantum operations are implemented using microwave pulses that manipulate or read the qubits, there is a continual need to dissipate heat. Over repeated algorithm runs, thermal heating results in a more rapid loss of quantum information through decoherence, stark shift induced loss of gate fidelity, and degradation of system performance until a recalibration cycle is needed. Current mitigation efforts focus on minimizing the algorithm circuit depth, capping RF radiation to the dissipation rate of the refrigeration unit, or leaving the problem to the future.

One embodiment of the invention implements a dynamic scheduling module that reorders qubit addressing and circuit scheduling operations by maintaining an activity map (or "heat map") of a qubit plane during continuous operation of the quantum computer. While the embodiments of the invention described here track operations in a 2D plane, the underlying principles of the invention are not limited to a 2D tracking arrangement. For example, activity maps may also be implemented for 1D or 3D qbit arrangements.

Figure 2:
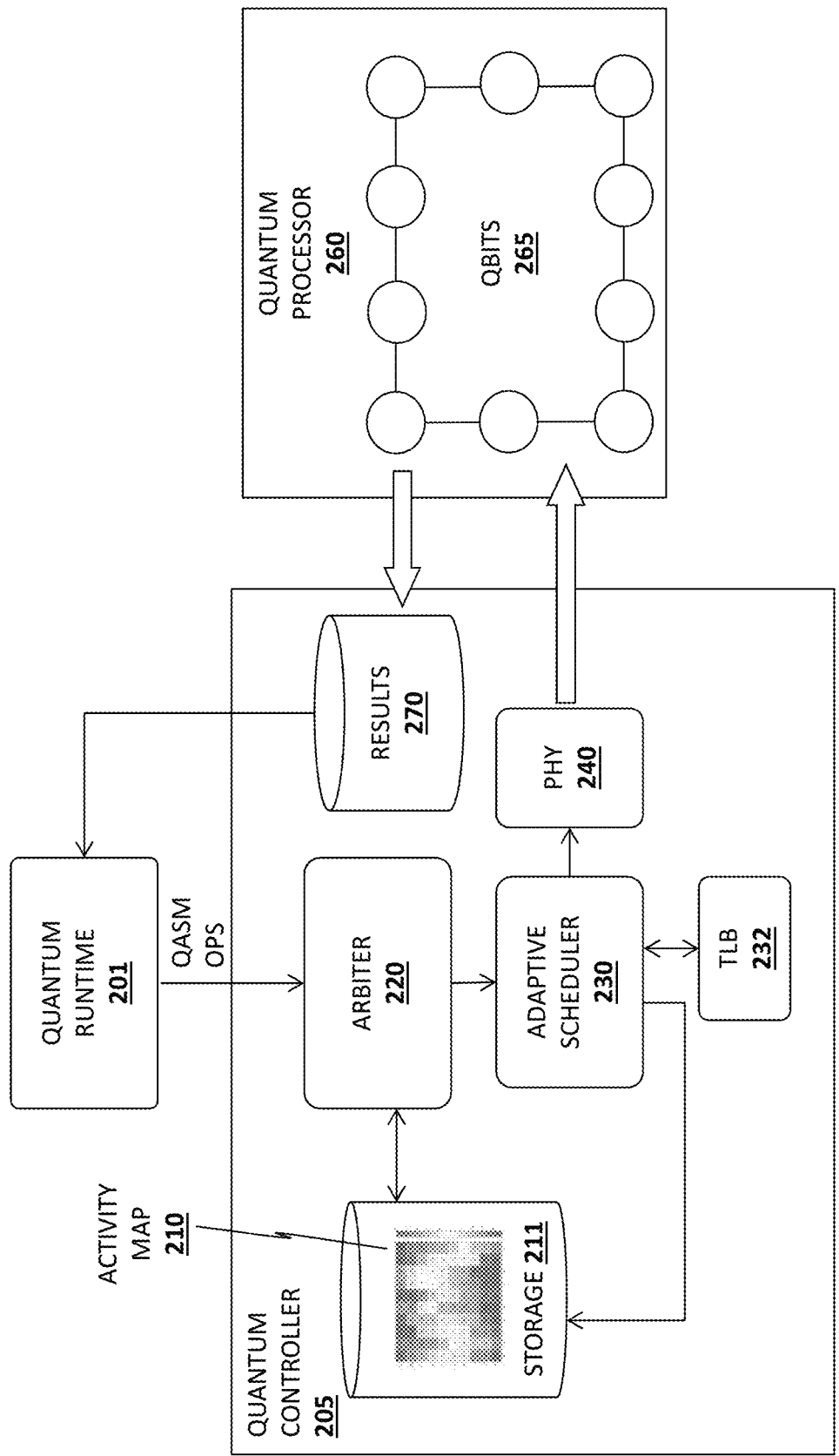
FIG. 2 illustrates one embodiment of a quantum controller for maintaining and utilizing an activity map to reduce heating within a quantum processor.

FIG. 2 illustrates an exemplary quantum computing architecture in which qbits 265 of a quantum processor 260 are manipulated in response to signals from a quantum controller 205. Any type of qbits 265 may be used within the quantum processor 260 including, by way of example, and not limitation, trapped ion qbits and quantum dots. In one embodiment, the quantum controller 205 implements a quantum runtime 201 specified by a programmer. For example, the quantum runtime 201 may comprise software executed on a general purpose processor. The quantum controller 205 may include both a general purpose processor to execute software and specialized circuitry to control the qbits (certain aspects of which are described herein). In response to execution of the quantum runtime code 201, the quantum processor 260 performs operations on the qbits 265 to generate results 270. In one implementation, multiple iterations of a particular operation or series of operations are required to generate the results 270.

In one embodiment, an arbiter 220 monitors access to the qbits 265 in accordance with the quantum runtime code 201 and updates an activity map 210 stored in a storage device 211 on the quantum controller 205. The activity map 210 may be updated in accordance with the frequency with which operations are performed on each of the qbits 265. In one embodiment, for example, an activity value associated with each qbit is incremented by an amount proportional to the pulse energy applied to that qbit and is decremented periodically (e.g., based on a heat dissipation rate associated with the system). In this implementation, the activity map 210 includes an identifier associated with each qbit (e.g., the qbit's virtual or physical address) and a current activity value which is continually updated based on pulse frequency and the heat dissipation rate. The activity map 210 may also be referred to as a heat map because it displays the heat produced in each region of the quantum processor 260 and/or surrounding each qbit 265.

In one embodiment, the arbiter 220 uses the above techniques to detect excessive heating and signals the adaptive scheduler 230 to move qubits to different regions to spread the heat more evenly. The adaptive scheduler 230 then configures and schedules operations on each of the qbits 265 based on the activity map 210. For example, if the activity map indicates that a particular qbit or region of qbits has significant recent activity (indicating a higher temperature), then the scheduler 230 may redirect operations to a new set of qbits 265 in a different region of the quantum processor 260. For example, in one embodiment, the adaptive scheduler 230 changes the physical quantum gates being used if the activity map 210 indicates that the current set of quantum gates have potentially become noisier due to heating.

One or more physical layer devices 240 perform the underlying operations on the qbits 265 as specified by the quantum runtime 201. For example, the physical layer devices 240 may include electromagnetic transmitters to generate microwave pulses or other electromagnetic pulses to manipulate the qbits 265.

Figure 3:
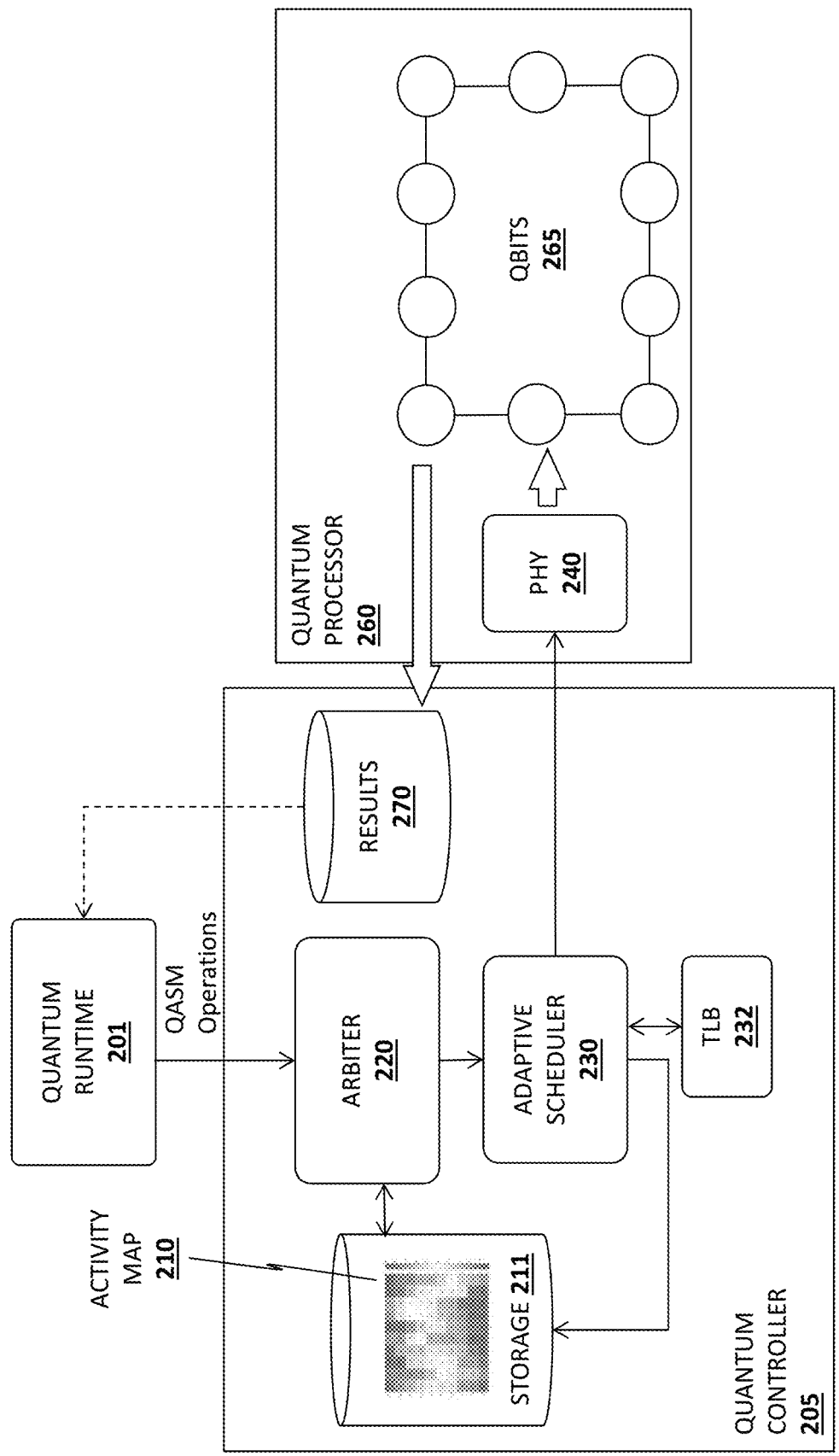
FIG. 3 illustrates another embodiment of a quantum controller for maintaining and utilizing an activity map to reduce heating within a quantum processor.

FIG. 3 illustrates an alternate embodiment in which the physical layer devices 240 are integrated within the quantum processor rather than the quantum controller 205. In this embodiment, the quantum controller 205 is communicatively coupled to the physical layer devices 240 of the quantum processor 260 over one or more serial communication interconnects (e.g., a Universal Serial Bus or comparable serial interface) or network interconnects (e.g., Ethernet, WiFi, etc). Of course, the underlying principles of the invention are not limited to any particular arrangement of the physical layer devices 240 or the particular communication protocol for coupling the quantum controller 205 to the quantum processor 260.

In one embodiment, the results 270 of the qbit operations are stored in a database, file system, or other form of data storage structure. While illustrated separately from the quantum runtime 201 and quantum controller 205, the results 270, quantum controller 205 and quantum runtime 201 may all be implemented on the same physical computing device such as a server or workstation with a memory, at least one processor, a storage device and a serial and/or wireless communication interfaces to couple the quantum controller 205 to a network.

As indicated in FIGS. 2-3, one embodiment of the quantum runtime 201 transmits operations to the quantum controller 205 in accordance with the Open Quantum Assembly Language (QASM), an intermediate representation for quantum instructions. However, the underlying principles of the invention are not limited to any particular language.

In one embodiment, the adaptive scheduler 230 is coupled to (or includes) a translation lookaside buffer (TLB) 232 to translate virtual qbit addresses to physical qbit addresses which identify the physical layer device 240 to access each of the qbits 265. In one implementation, the adaptive scheduler changes physical qubit addressing within the TLB 232 in accordance with the activity map 210 to ensure that a particular set of one or more qbits 265 are not over-utilized. For example, the adaptive scheduler 230 may associate new physical addresses for a new set of qbits 265 with existing virtual addresses in the TLB 232, thereby spreading the heat more evenly across the qbits 265.

Figure 4:
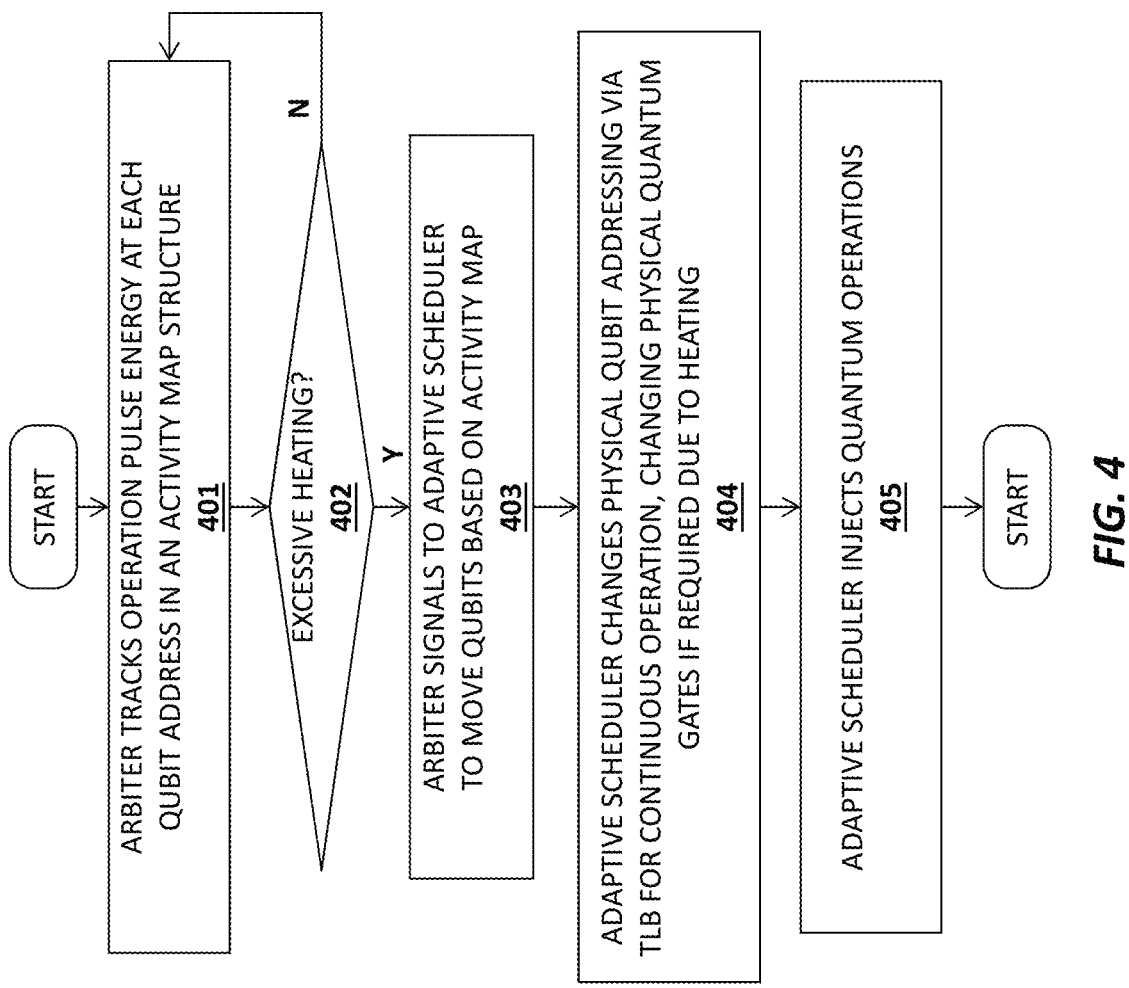
FIG. 4 illustrates a method in accordance with one embodiment of the invention.

A method in accordance with one embodiment is illustrated in FIG. 4. The method may be implemented on the specific architectures described above, but is not limited to any particular quantum architecture.

At 401 an arbiter tracks operation pulse energy applied at each qbit address over time in an activity map structure. As mentioned, the activity map is read to determine whether excessive heating has occurred with respect to a particular set of quantum gates/qbits. For example, if a particular gate/qbit has been energized above a specified threshold within a specified period of time, then excessive heating is determined at 402. As a result, at 403 the arbiter signals to the adaptive scheduler to move qbits based on the activity map. At 404, the adaptive scheduler changes physical qbit addressing via a TLB to ensure continuous operation, changing the physical quantum gates if necessary due to heating. At 405, the adaptive scheduler injects the quantum operations into the quantum processor which performs the operations and generates results 270.

As a result of the reduction in heating associated with each gate/qbit, the embodiments of the invention increase up-time of a quantum computer for continuous algorithm execution. For example, the need for recalibration cycles is reduced, thereby providing a performance advantage over existing systems. Larger circuit depth algorithms may also be executed, resulting in longer calculations.

Adaptive Error Correction and Control of a Quantum Computer Using a Spiking Neural Net Qubits are fragile and respond to various sources of noise which introduces challenges in scalability to large numbers of physical qubits. Quantum Error Correction for quantum computers is implemented by encoding a logical qubit in a set of physical qubits. These physical qubits are periodically measured in an error correction cycle and the results are used to detect whether an error has occurred (e.g., a random flip of a qubit). The error cycle completes with a correction of the encoding.

The process of detecting errors and classifying them to enable correction is complex and expensive in execution time and energy. Some alternative approaches using Neural Network methods are being proposed in order to reduce these costs. However, none of the proposed methods adapt to changing error behavior over the life cycle of the chip. Most require the choice of encoding to be set at design time and remain fixed through the operation of the device.

Figure 7:
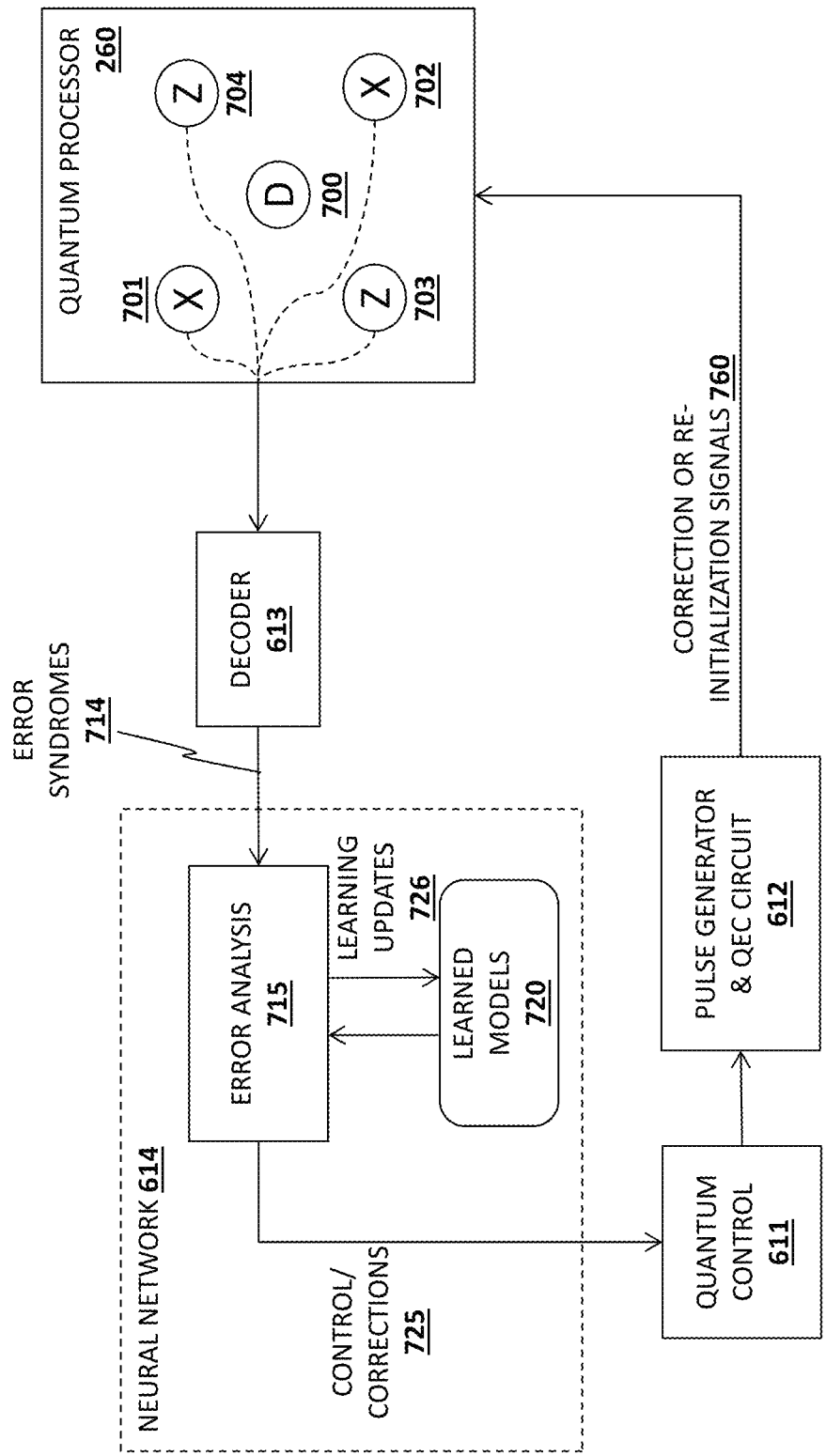
FIG. 7 illustrates additional details of one embodiment of the quantum controller.

One embodiment of the invention uses a particular form of neural network implementation as embodied in a neuromorphic chip which is more energy efficient than a conventional neural network implemented in software or hardware. FIG. 7 (described below) illustrates an example neuromorphic architecture with which embodiments of the invention may be implemented.

During breaks in the normal computation cycle of the quantum computer, diagnostic workloads are executed for which correct outcomes are known. The spiking neural network within the neuromorphic processor then uses the results of the algorithmic runs combined with the Quantum Error Correction cycle measurements to detect new types of errors discovered in the system and continually retrain itself to classify and correct for this new source of error.

Existing neural network based approaches focus on large training data sets that have been generated for specific types of errors that they expect to encounter in a quantum system of a specific size. These approaches require a large up-front investment in tuning the training data to catch a large percentage of errors whereas the embodiments of the invention adapt dynamically both to the specific quantum processor being used and continuously learn and adapts as new errors appear in each individual system over time. This also results in a more efficient neural network which does not have sensitivity to the training data set and thus does not store redundant sources of errors that have a low probability of ever occurring. A spiking neural network based learning approach as represented by the example neuromorphic processor described below is also likely to be highly more energy efficient because the network only encodes errors it has actually encountered; consequently, less computation is required to parse a large training data set. The types of errors that the system can correct for is also expanded to error propagation in quantum circuits because it distinguishes timing-based errors from those encountered when applying a single quantum operation.

Figure 5:
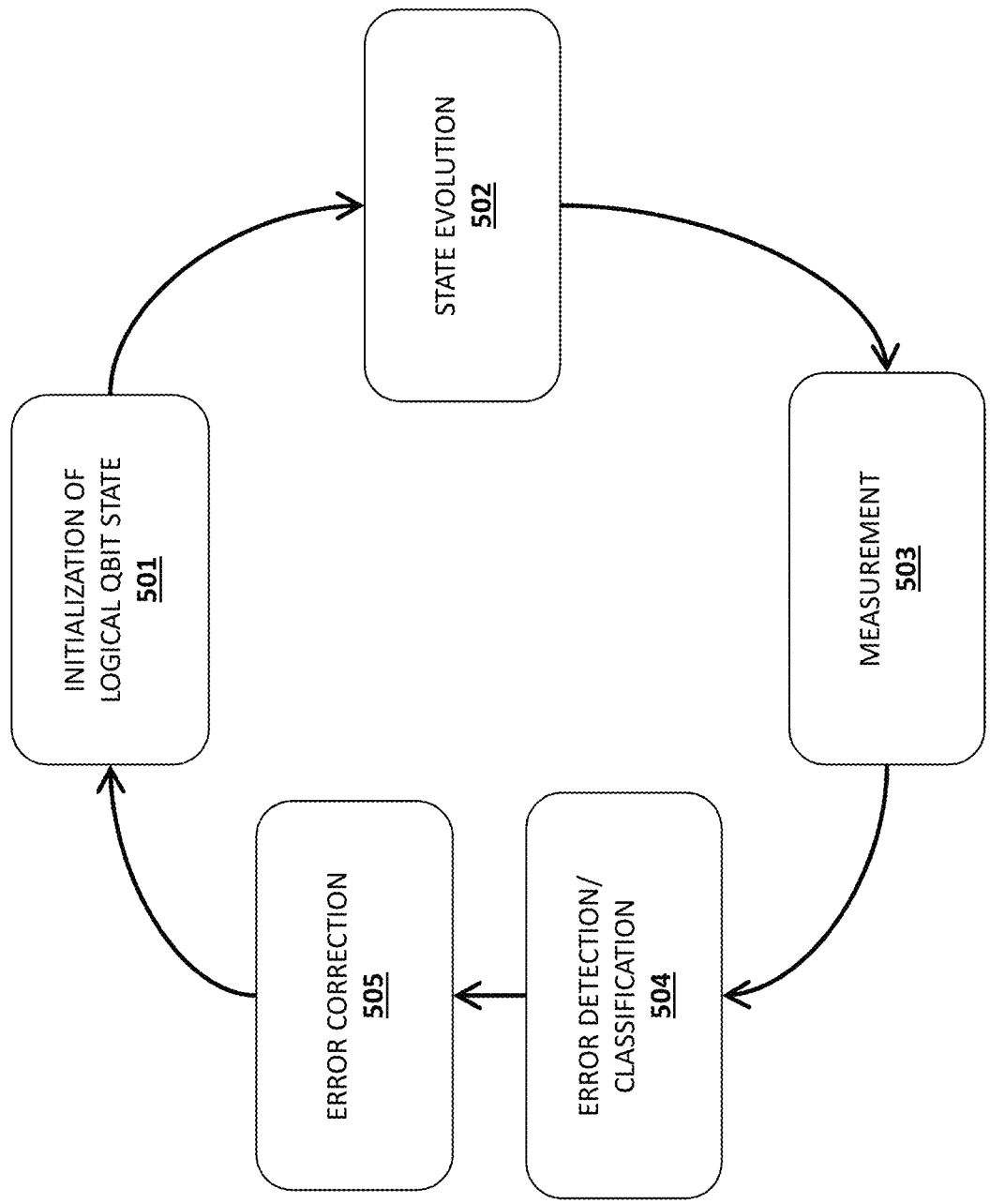
FIG. 5 illustrates a sequence of operations for performing error correction.

FIG. 5 illustrates one embodiment of a quantum error correction cycle. At 501 the logical qbit state of the system is initialized. For example, if electron spin is used as the quantum state, then electrons within the quantum system may be prepared (e.g., initialized to a particular spin orientation and/or entangled using electromagnetic control signals from the quantum controller).

At 502, the state of the quantum system evolves in response to additional electromagnetic inputs specified by the quantum runtime 201 and implemented by the quantum controller 205.

At 503, a measurement of the quantum system is taken. For example, the current spin of one of the entangled electrons may be measured. The system may subsequently be re-initialized prior to the next measurement (i.e., given that taking a measurement or learning any information about the quantum system disrupts the quantum state). The physical qubits may be periodically measured in an error correction cycle. At 504 error detection/classification is performed on the measured results to determine whether an error has occurred (e.g., a random flip of a qubit). The error cycle completes with an error correction operation at 505, which attempts to correct any detected errors detected.

Figure 6:
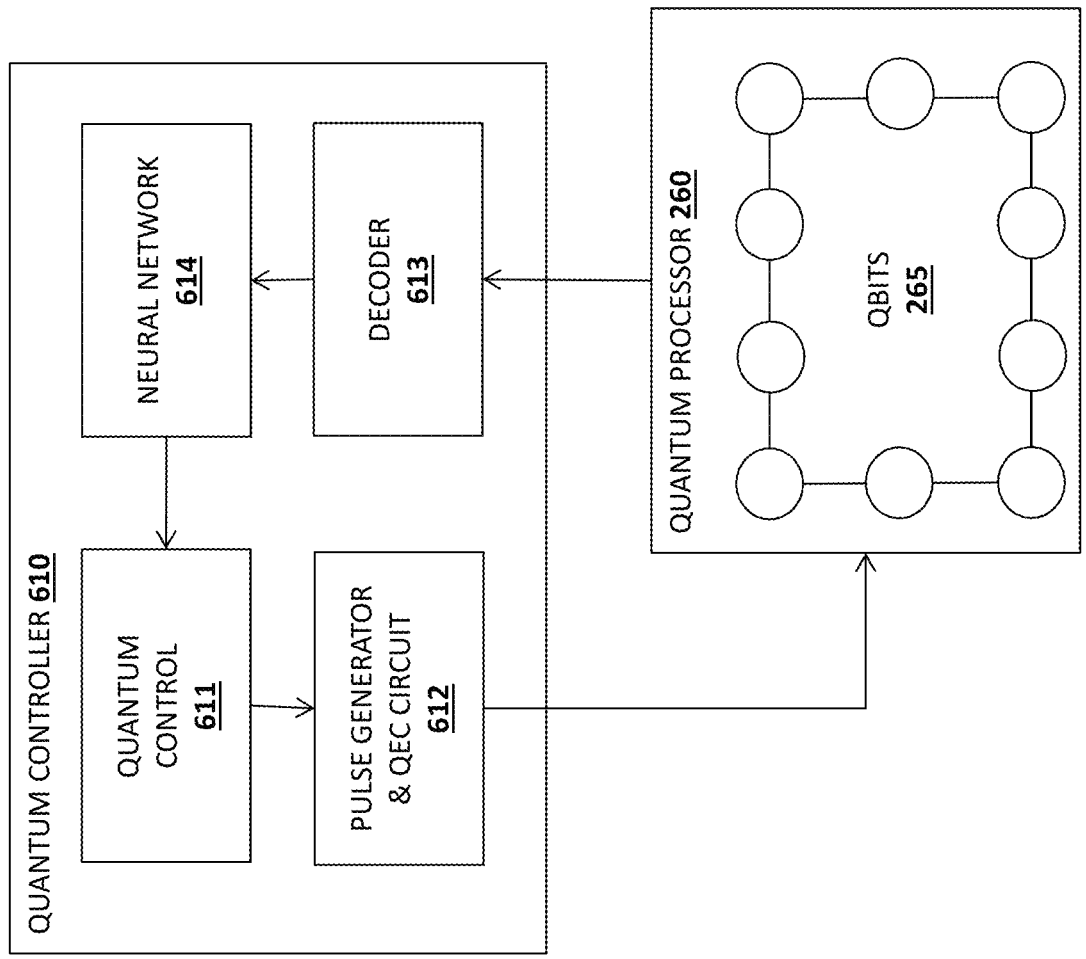
FIG. 6 illustrates one embodiment of a quantum controller using a neural network such as a neuromorphic processor.

FIG. 6 illustrates an exemplary quantum controller 610 for performing quantum error detection and correction on results generated by a quantum processor 260. In one embodiment, a neural network 614 performs unsupervised learning of error syndromes through execution of a diagnostic learning cycle during idle cycles of the quantum computer. In one embodiment, the neural network 614 is a neuromorphic processor but can be implemented with any circuitry and/or logic capable of unsupervised learning.

In operation, a decoder 613 takes a multi-qubit measurement from the quantum processor 260 which does not disturb the quantum information in the encoded state but contains information about the error (as described in greater detail below). In response, the decoder 613 generates error syndrome data from which the neural network 614 may determine the error(s) that have occurred and take steps to correct the error(s). In one embodiment, the error syndrome data comprises a stabilizer code such as a surface code. However, the underlying principles of the invention may be implemented on quantum systems using various types of error syndrome coding.

Upon evaluating the error syndrome data, the neural network 614 may rely on any previously learned errors to select a response, which it transmits to the quantum control unit 611. In some cases, the response may simply be to reinitialize the qbits and start over. In other cases, however, modifications to the quantum algorithm can be made to stabilize the region of the quantum processor responsible for the error. In either case, a pulse generator & QEC circuit 612 performs the underlying physical operations under the control of the quantum control unit 611. For example, the pulse generator & QEC circuit generate electromagnetic pulses to adjust the phase of one or more qbits in accordance with the detected phase error, or to reset the phase/spin of all qbits if re-initialization is required.

In one implementation, the neural network 614 is configured to learn new error syndromes as they occur. For example, once the quantum computer enters a quiescent state, a diagnostic mode may be executed in which a specific set of representative quantum algorithms with known outcomes is executed and the results decoded by the decoder 613. When the neural network 614 detects a deviation from the expected result, it attempts to learn where in the error correction tile a new error syndrome has occurred. These errors could be in the physical operations necessary to implement the fault tolerant surface code tile. For example, the physical operations necessary to realize certain logical gates get translated into a fixed set of physical operations which may incur errors.

In such a case, the algorithms may be re-executed on a more robust part of the quantum processor 260. The neural network 614 may then compare the results to those collected from the more faulty part of the chip. The neural network 614 then retrains itself to recognize this error on the noisy part of the chip and potentially correct for it.

In addition, the neural network 614 may determine whether it has improved the system performance or degraded it through several more runs of the quantum algorithm. If it determines that it has successfully corrected for a new source of error then it will retain the learning. Otherwise, it will abandon it and continue attempting to learn additional error sources during the diagnostic process.

FIG. 7 illustrates additional details of one embodiment in which the quantum processor 260 includes a plurality of ancilla qubits 701-704 which are used to protect the integrity of the data encoded in the data qbits 700 (which contain the underlying data resulting from a quantum operation). In one implementation, the ancilla qubits 701-704 can be measured without disturbing the quantum information encoded in the data qbits 700 but can still provide information about the error(s) in the data qbit(s). In particular, the error syndrome data from the ancilla qbits 701-704 can be used to determine whether a data qubit 700 has been corrupted, and if so, which one. Further, the error syndrome code produced by the decoder 613 in response to reading the ancilla qbits 701-704 can identify not only the physical qubit which was affected, but also in which of several possible ways it was affected.

Two types of ancilla qbits are illustrated in FIG. 7, X-syndrome qbits 701-702 and Z-syndrome qbits 703-704, which are used to differentiate between phase-flip syndromes (or X-syndromes) and bit-flip syndromes (or Z-syndromes), respectively. In the illustrated embodiment, each data qubit 700 is coupled with two X-syndrome qubits 701-702 and two Z-syndrome qubits 703-704. Moreover, each syndrome qubit 701-704 is coupled with four code qubits 700 (only one of which is illustrated for simplicity). In one embodiment, the X-syndrome qbits are associated with a bit-flip error and the Z-syndrome qbits are associated with a phase-flip error. However, the underlying principles of the invention are not limited to any particular coding scheme.

Regardless of the specific type of coding used, the decoder 613 generates an error syndrome code 714 in response to reading the ancilla qbits 701-703 and error analysis 715 is performed in the neural network 614 to classify and correct the detected error(s) using previously learned models 720. For example, if the error syndrome 714 identifies an error which the error analysis has seen and corrected in the past, then it will send control/correction data 725 informing the quantum control unit 611 of the sequence of operations required to correct the error. The quantum control unit 611 will then cause the pulse generator & QEC circuitry 612 to perform the underlying physical operations on the data qbits 700. For example, in response to two Z-syndrome qbits being out of parity, the error analysis unit 715 may conclude (based on prior learning) that a phase flip has occurred on the data qbit 700 has occurred. As such, it may send corrective data 725 to the quantum control unit 611 to implement a phase shift on the data qbit 700 set it to the correct phase.

In one embodiment, when the error analysis unit 715 detects an error syndrome 714 which it has not seen before, it will attempt to identify any correlations between the new error syndrome and the learned models 720 and will generate control/correction data 725 based on any correlation it can identify. After sending the correction data 725, the quantum control unit 611 will cause the recommended correction to be implemented via the pulse generator & QEC circuit 612. If the corrective recommendation did not resolve the error, the error analysis unit 715 will make another attempt based on the new error syndrome data 714. For example, if the recommended correction made the error more pronounced, then it may generate new correction data 725 based on a different variable or using an alternate value for a prior variable.

By generating informed corrections and analyzing the results of those corrections, the error analysis unit 715 may eventually pinpoint a corrective action which resolves the error encoded in the error syndrome 714. Once it does, it stores this new corrective data within the set of learned models 720 so that it can take immediate corrective action the next time it sees this particular error syndrome.

Using the above techniques the neural network 614 may perform unsupervised learning of new error syndromes 714 as they occur. Unsupervised learning is particularly beneficial for working with a quantum processor 260 because the physical responses of the individual qbits may change over time and may also vary from one quantum processor to another. In one implementation, the neural network 614 is initially equipped with a set of basic models 720 which are commonly used to detect and correct certain types of well known errors. Starting with this base set of models 720, the neural network 624 will continually train itself in response to detecting new error syndromes 714 and update the models 720 accordingly. As a result, the neural network 614 will become familiar with the particular characteristics of the quantum processor 260 with which it is associated and will learn to correct various different types of errors, some of which may be unique to this quantum processor 260.

While the error analysis unit 715 may successfully correct a number of different errors, some types of errors may be uncorrectable. In this case (e.g., after a threshold number of attempts), the error analysis unit 715 may transmit an initialization command to the quantum control unit 611, which will cause the qbits 700-705 to be re-initialized.

As mentioned, the neural network 614 may be implemented with circuitry such as a neuromorphic processor to perform unsupervised learning of quantum error syndromes. In this embodiment, the error analysis unit 715 and learned models 720 are integrated within the neuromorphic processor weighted interconnections between neurons and other data related to these interconnections. Consequently, the error analysis unit 715 and models 720 may not be separate components as shown in FIG. 7 but rather may be distributed across the neuromorphic processor using interconnections and associated weights/data. Moreover, the underlying principles of the invention are not limited to a neuromorphic processor implementation and may, in fact, be implemented using any processor capable of unsupervised learning.

Figure 8:
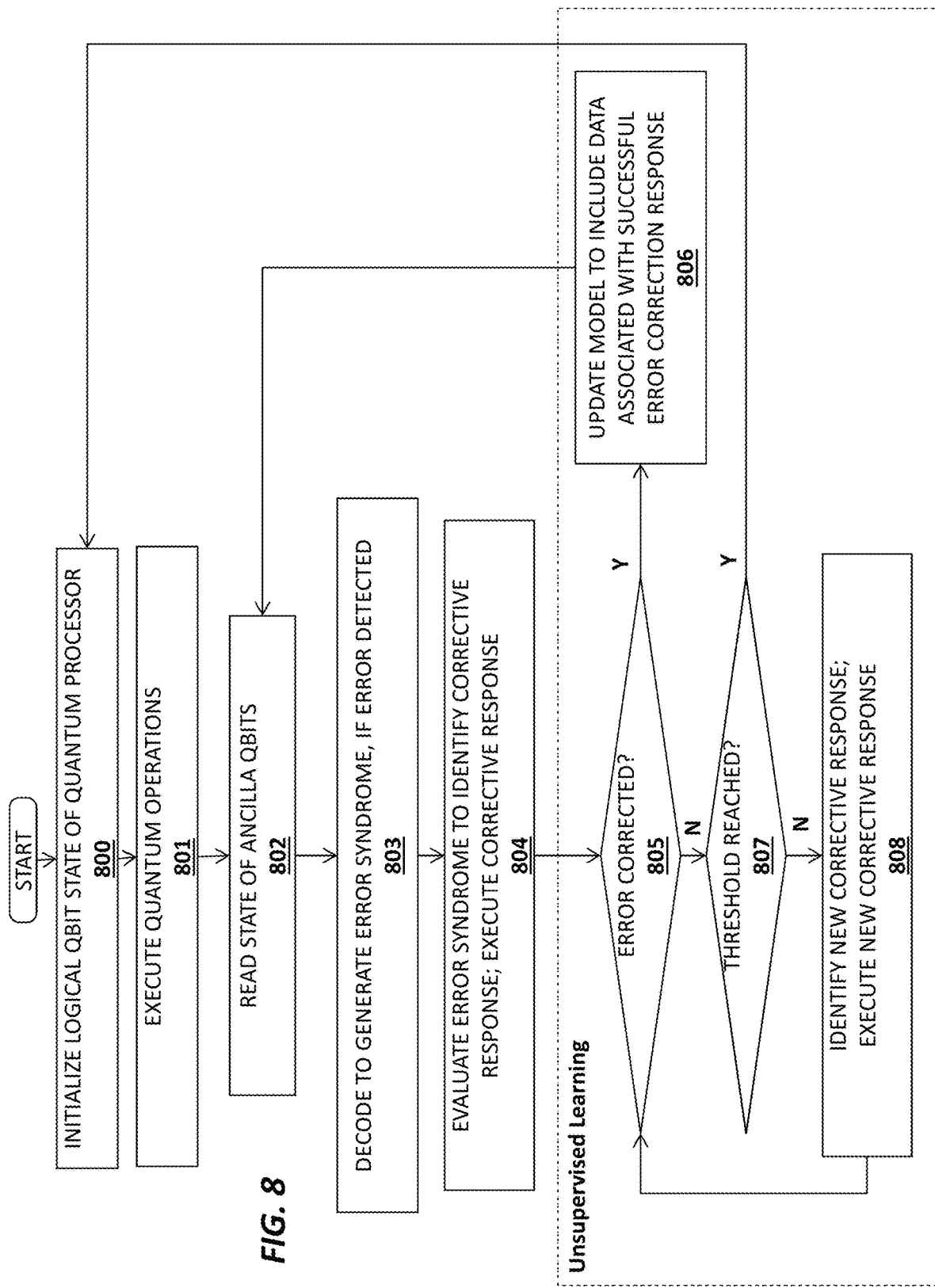
FIG. 8 illustrates one embodiment of a method for detecting and correcting errors.

A method in accordance with one embodiment is illustrated in FIG. 8. The method may be implemented within the context of the quantum system architectures described herein, but is not limited to any particular type of quantum system.

At 800 the logical states of qbits are initialized on the quantum processor and, at 801, quantum operations are executed (e.g., in accordance with a quantum runtime). As mentioned, the techniques described herein may be implemented once the quantum computer enters a quiescent state. A diagnostic mode may then be executed in which a specific set of representative quantum algorithms with known outcomes is executed. In addition, these learning techniques may be performed during normal system operation.

At 802 the state of the ancilla qbits is read and, at 803, decoded to generate an error syndrome, if an error is detected. If there is no error then the process may return to 801 using a different set of quantum operations. At 804, the error syndrome is evaluated to identify a response, which is then executed. As described above, the response may be selected by a neuromorphic processor based on existing error correction models. For example, if the error has been seen before, then the model will specify the corrective response for this particular error.

If the corrective response successfully corrects the error, determined at 805, then at 806, the model may be updated to include data associated with the successful corrective response. If the corrective response does not correct the error then a determination is made at 807 as to whether a threshold number of error correction attempts have been made. If so, then the qbits are re-initialized at 800. If not, then at 808, a new corrective response is identified and executed and the process returns to 805, where a determination is made as to whether the error was corrected. As indicated in FIG. 8, operations 805-808 comprise unsupervised learning performed by the neural network in one embodiment.

The embodiments described herein may be used to improve fault tolerance and reduce errors in quantum computing systems. Enhanced energy efficiency in providing scalable error correction will also reduce the cost to produce these platforms when compared to heuristic based approaches and techniques which rely on large training data sets. In addition, unsupervised learning of error conditions will improve the adaptability of quantum computing systems over time and across different quantum processors.

Current neural network approaches to fault tolerance assume a fixed set of error syndromes across all quantum computing hardware implementations. In contrast, the techniques described herein assume that these syndromes will be different across all hardware implementations and thus must be dynamically learned through operation of the platform. Moreover, one embodiment relies on the execution of a set of diagnostic quantum computing workloads which is at a higher level than existing approaches that focus on the operation of physical qubits in the error correction scheme. The described implementation utilizes this lower level in combination with higher level algorithms.

An Exemplary Neuromorphic Processor

In one embodiment of the invention, the neural network 614 is a neuromorphic processor utilizing a network of small-scale neuromorphic cores. One example of this is the energy-efficient neuromorphic chip designed by the assignee of the present application which mimics brain function by learning from various modes of feedback from its environment. However, other types of neural network circuits may be used.

In one embodiment of the neural network 614, each neuron can send spike signals to any target neuron in the same core or other cores. The spiking activity of neurons are controlled stochastically by a pseudo-random number generator (PRNG) to enable spike integration by other neurons between the inter-spike intervals. Each neuromorphic core has an associated PRNG to enable spiking activity and time-step updates of neurons in that core. The target neurons integrate the spikes as they arrive through the Network on Chip (NoC) between their inter-spike intervals as determined by the PRNG associated with each core. With this approach, neurons spike in free-running fashion while the incoming spikes are integrated in an event-driven manner.

Figure 9:
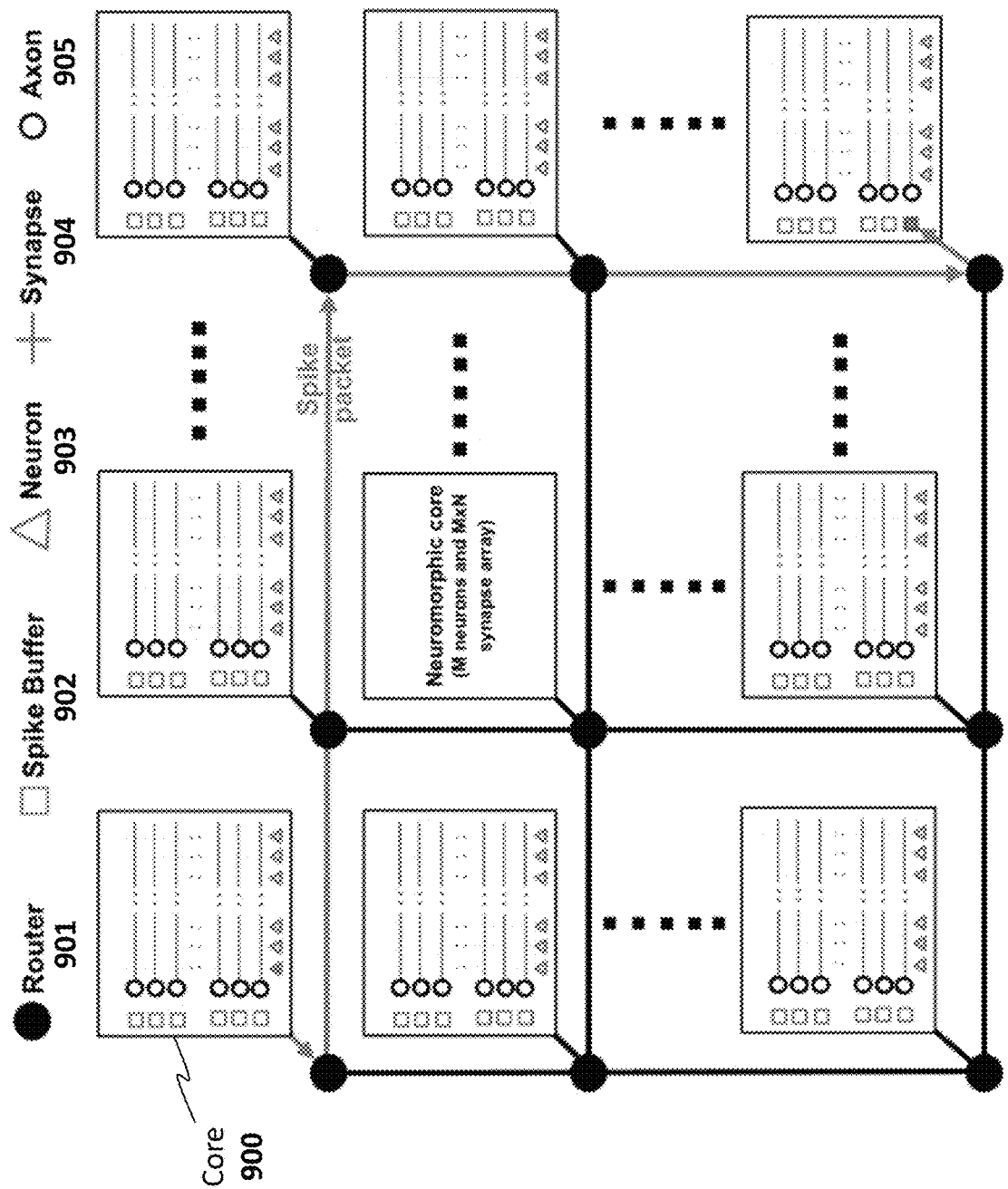
FIG. 9 is a block diagram illustrating an exemplary neuromorphic processor architecture.

FIG. 9 illustrates an example neuromorphic computer which employs spike buffers 902 to store the incoming spikes in a core 900 and a controller triggers the spike integration and spike generation activities for all the neurons 903 in that core. Each spike buffer is coupled to an axon 905 and neuromorphic cores 900 are interconnected via routers 901. Each entry in the spike buffer 902 contains the input spikes to the neuromorphic core for one timestep. Within each timestep, all the input spikes are integrated. Once all the neurons 903 in the entire spiking neural network have completed integration and thresholding, the network proceeds to the next timestep.

Figure 10:
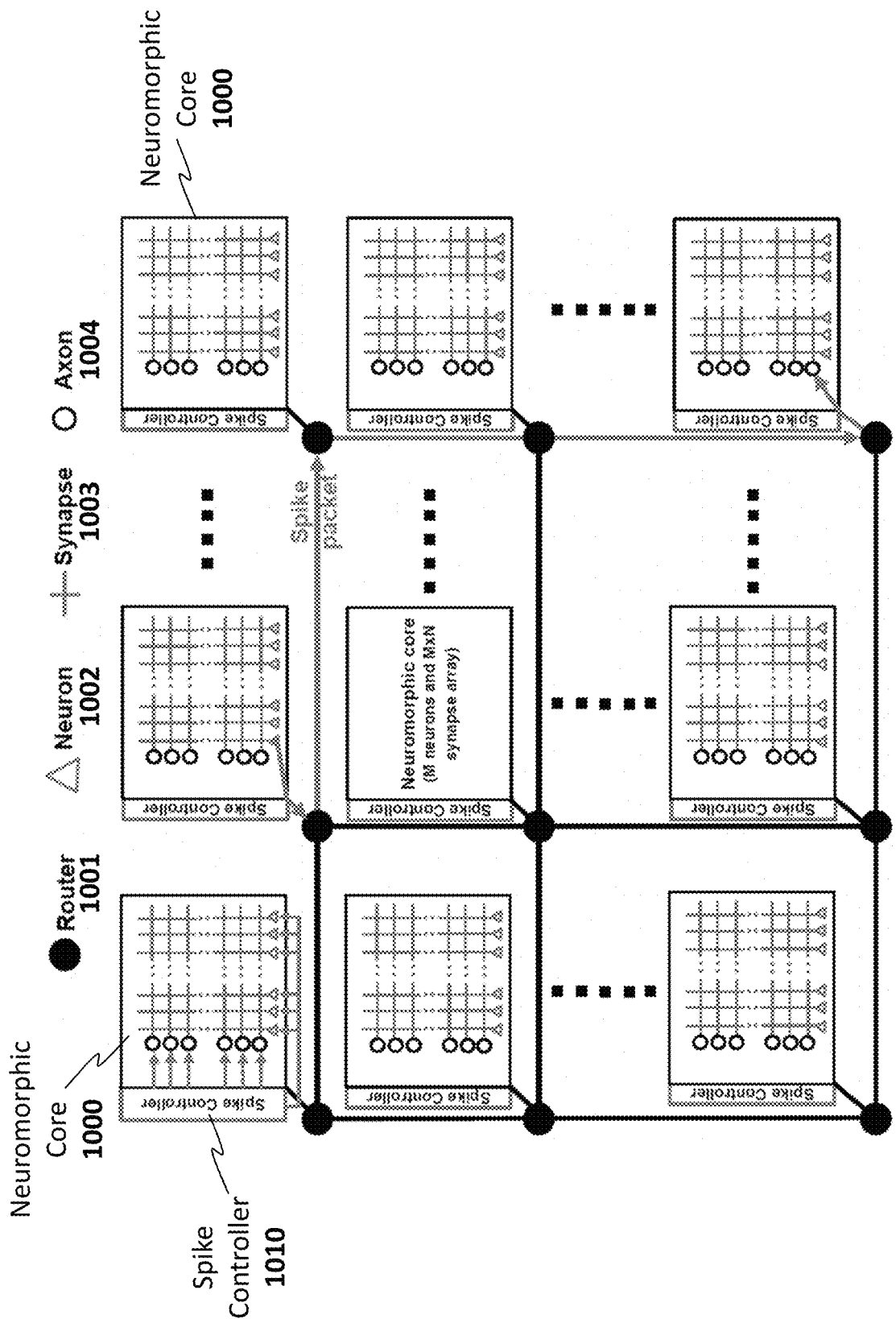
FIG. 10 illustrates one embodiment of a neuromorphic processor which includes spike controllers for generating trigger signals.

FIG. 10 illustrates another embodiment of a neuromorphic chip which uses a scalable free-running network of neuromorphic cores 1000 to build massively interconnected large-scale neuromorphic computers. The spiking activity of neurons 1002 in a core are controlled stochastically by a spike controller 1010 such that each neuron 1002 gets a chance to spike within a time step. Stochasticity in the firing time reduces spike collisions in the neuromorphic computer.

Figure 11:
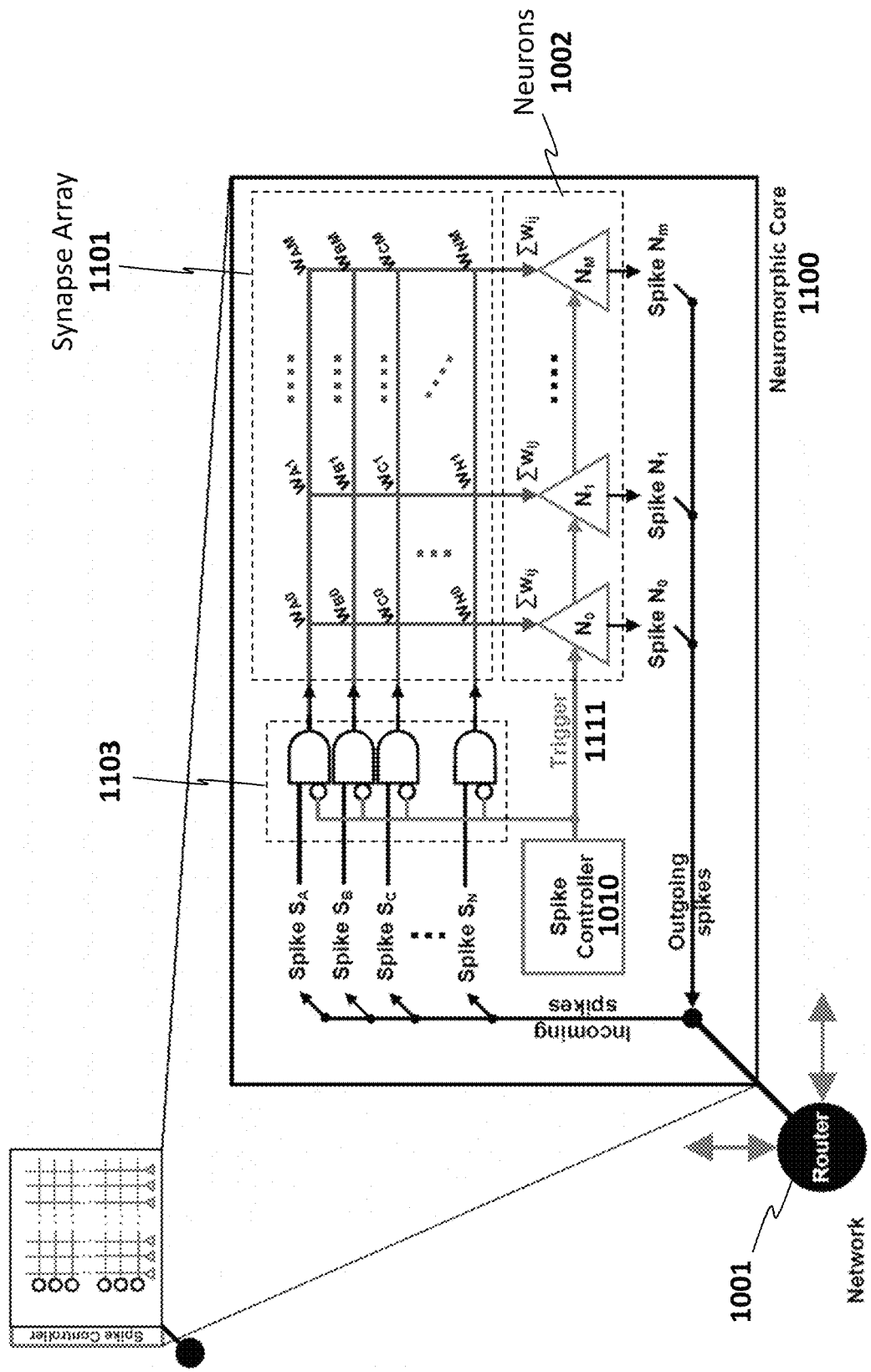
FIG. 11 illustrates one embodiment of a neuromorphic core.

By way of example, and not limitation, FIG. 11 illustrates a neuromorphic core 1100 with M neurons 1002 and M×N synapse array 1101, where N is the number of fan-in connections for a neuron. In one embodiment, the spike controller 1010 generates a trigger signal for a neuron 1002 selected randomly within a core (e.g., neuron N1) and the neuron generates a spike upon threshold comparison. The outgoing spikes may be routed back into the neuromorphic core 1000 and/or routed to neurons in other neuromorphic cores via router 1001. When the trigger signal 1011 is at logic low, the neurons 1002 in the core keep integrating the incoming spikes as they arrive. Once the neuron N1 generates a spike as determined by the trigger signal and threshold comparison, the spike packet is then sent to the target neuron(s), where the spike is integrated and membrane potential is updated. By adjusting the interval of the trigger signal 1011 generated from the spike controllers 1010, the free-running network enables the neurons to perform spike integration as the incoming fan-in spikes are received. In one embodiment, the pseudo-random number generator (PRNG) in the spike controller 1010 controls the trigger signal 1111 generation such that the collisions in the network are minimal (i.e., because of the randomness inserted via the PRNG). Even if there are collisions, the stochastic nature of PRNG ensures that the collisions are not periodic and appear as noise in the network. The network can be configured to either drop or block the residual collisions that happen after adjusting the interval of trigger signal 1111 generation using the PRNG. The spike integration of all fan-in spikes for a particular neuron is performed within its spiking interval as determined by the trigger signal's frequency. This approach mitigates the need to deploy spike buffers to store incoming fan-in spikes and performs spike integration on-the-fly as they are received.

Figure 12:
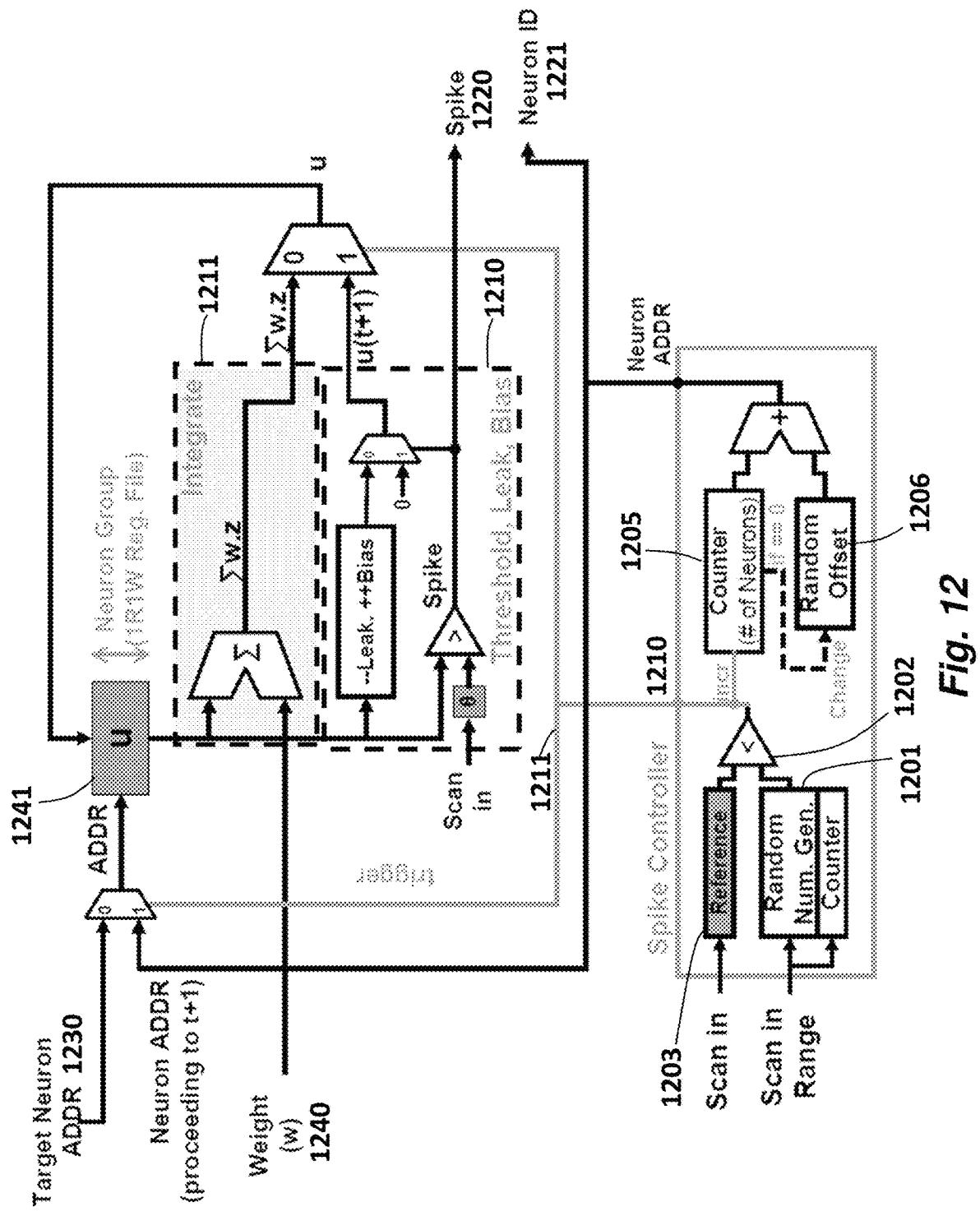
FIG. 12 illustrates one embodiment of a spike controller.

One embodiment of a spike controller and neuron group in a neuromorphic core is illustrated in FIG. 12. The leaky integrate-and-fire neuron model is used in neuromorphic core shown in FIG. 12. One of the key components of the spike controller 1210 is a pseudo-random number generator 1201. In the illustrated implementation, a comparator 1202 compares the random number generated by PRNG 1201 with a reference value 1203 and when the random number is lower than the reference value, the trigger signal 1211 is asserted high. The periodicity of PRNG is set to a high value when compared to the reference value 1203 to ensure that the interval between subsequent trigger signal assertions is low enough to enable ample duration for spike integration by integration circuitry 1211 by all the neurons.

In one embodiment, when the trigger signal 1210 is asserted high, a counter 1205 in the spike controller 1210 is incremented, which in turn selects a neuron 1202 in the core 1200. The counter width (q) may be set according to the number of neurons in the core (e.g., N=2q) and the counter value 1205 is used as the address to select a neuron from the group. To add more stochasticity in neuron spiking activity, a random offset 1206 may be mixed with the counter value 1205 such that the order of spiking activity in a neuromorphic core is random across different time steps.

Once the trigger signal 1211 is asserted high, the neuron selected by spike controller 1210 undergoes thresholding, spike generation if the membrane potential is larger than the threshold, and timestep update processes, as implemented by threshold/leak/bias circuit 1210. The spike packet 1220 is then transferred to all the fan-out connections along with the spiking neuron's address 1221 (counter value and core ID). If the membrane potential is lower than threshold, the neuron undergoes a leak operation via threshold/leak/bias circuitry 1210. When the trigger signal is at logic low, the neurons in the core integrate all the incoming spikes in the order they arrive as selected by the target address 1230. During the integration process performed by integration circuit 1211, the corresponding weight values 1240 are added with the current membrane potential (u) 1241 and written back into the same register. By adjusting the period of PRNG 1201 in the spike controllers 1210 and setting the reference value 1203 low, the spiking activity of neurons across the large-scale neuromorphic computer can be controlled to enable thresholding and timestep update or spike integration with very minimal collisions in the network. As the timestep update happens locally within a core, the embodiments described herein eliminate the need to route global synchronization signals which results in significant routing area and power savings.

In the above detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments. Terms like "first," "second," "third," etc. do not imply a particular ordering, unless otherwise specified.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hard-wired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.).

In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

What is claimed is:

1. An apparatus comprising:
   a quantum processor comprising one or more data quantum bits (qbits) and one or more ancilla qbits;
   an error decoder to decode a state of at least one of the ancilla qbits to generate an error syndrome related to one or more qbit errors; and
   a neural network to evaluate the error syndrome and to identify a known corrective response for correcting errors associated with the error syndrome when the error syndrome is identifiable as corresponding to the known corrective response, and to perform unsupervised learning to identify a corrective response to the error syndrome when the error syndrome is not identifiable as corresponding to a known corrective response, wherein the unsupervised learning implemented by the neural network comprises:
   identifying a first potential corrective response to the error syndrome based on an existing error correction model containing data related to known corrective responses for different error syndromes;
   causing the first potential corrective response to be implemented; and
   when the first potential corrective response corrects the one or more qbit errors, updating the existing error correction model to include data related to the one or more qbit errors.

2. The apparatus of claim 1 further comprising:
   a quantum control unit to cause a sequence of physical operations on the quantum processor to implement the corrective response generated by the neural network.

3. The apparatus of claim 2 wherein the ancilla qbits include at least one qbit related to a phase-flip error.

4. The apparatus of claim 3 wherein the quantum control unit is to cause one or more electromagnetic pulses to be generated to perform phase adjustments to a data qbit to compensate for the phase-flip error.

5. The apparatus of claim 1 wherein when the first potential corrective response does not correct the one or more qbit errors, the neural network is to select one or more additional potential corrective responses until one is identified which corrects the one or more qbit errors.

6. The apparatus of claim 5 wherein the neural network is to cause the data qbits to be re-initialized when a threshold number of attempts is reached to identify a corrective response.

7. The apparatus of claim 1 wherein the neural network comprises at least one neuromorphic processor.

8. The apparatus of claim 7 wherein the neuromorphic processor comprises a plurality of interconnected neuromorphic cores.

9. The apparatus of claim 8 wherein at least one neuromorphic core comprises a plurality of neurons interconnected through a synapse array comprising a plurality of interconnections, one or more of the interconnections having a membrane potential value associated therewith representing a strength of the interconnections.

10. The apparatus of claim 9 wherein the at least one neuromorphic core is to perform the unsupervised learning by changing the membrane potential values associated with each of the interconnections.

11. A method comprising:
    initializing one or more data quantum bits (qbits) and one or more ancilla qbits on a quantum processor;
    decoding a state of at least one of the ancilla qbits to generate an error syndrome related to one or more qbit errors; and
    evaluating the error syndrome using a neural network and identifying a known corrective response for correcting errors associated with the error syndrome when the error syndrome is identifiable as corresponding to the known corrective response, and performing unsupervised learning to identify a corrective response to the error syndrome when the error syndrome is not identifiable as corresponding to a known corrective response, wherein the unsupervised learning implemented by the neural network comprises:
    identifying a first potential corrective response to the error syndrome based on an existing error correction model containing data related to known corrective responses for different error syndromes;
    causing the first potential corrective response to be implemented; and
    when the first potential corrective response corrects the one or more qbit errors, updating the existing error correction model to include data related to the one or more qbit errors.

12. The method of claim 11 further comprising:
    causing a sequence of physical operations on the quantum processor to implement the corrective response generated by the neural network.

13. The method of claim 12 further comprising:
    selecting one or more additional potential corrective responses when the first potential corrective response does not correct the one or more qbit errors until one is identified which corrects the one or more qbit errors.

14. The method of claim 13 further comprising:
    re-initializing the data qbits when a threshold number of attempts is reached to identify a corrective response.

15. The method of claim 12 wherein the unsupervised learning is performed on at least one neuromorphic processor.

16. The method of claim 15 wherein the neuromorphic processor comprises a plurality of interconnected neuromorphic cores.

17. The method of claim 16 wherein at least one interconnected neuromorphic core comprises a plurality of neurons interconnected through a synapse array comprising a plurality of interconnections, one or more of the interconnections having a membrane potential value associated therewith representing a strength of the interconnections.

18. The method of claim 17 further comprising:
changing the membrane potential values associated with each of the interconnections to perform the unsupervised learning.

19. The method of claim 12 wherein the ancilla qbits include at least one qbit related to a phase-flip error.

20. The method of claim 19 further comprising:
generating one or more electromagnetic pulses to perform phase adjustments to a data qbit to compensate for the phase-flip error.

* * * * *